United States Patent [19]
Mazura

[11] Patent Number: 5,297,004
[45] Date of Patent: Mar. 22, 1994

[54] HOUSING

[75] Inventor: Paul Mazura, Karlsbad/Langensteinbach, Fed. Rep. of Germany

[73] Assignee: Schroff GmbH, Straubenhardt, Fed. Rep. of Germany

[21] Appl. No.: 69,603

[22] Filed: Jun. 1, 1993

[30] Foreign Application Priority Data

Jun. 1, 1992 [DE] Fed. Rep. of Germany ....... 4218007

[51] Int. Cl.⁵ .............................................. H05K 7/20
[52] U.S. Cl. .................................. 361/690; 62/259.2; 454/184; 454/358
[58] Field of Search .................... 62/259.2; 165/80.3; 361/381, 383, 384; 454/184, 358

[56] References Cited

U.S. PATENT DOCUMENTS

4,739,445 4/1988 Tragen .
5,119,270 6/1992 Bolton et al. ........................ 361/384

FOREIGN PATENT DOCUMENTS

| | | |
|---|---|---|
| 8212526 | 8/1982 | Fed. Rep. of Germany . |
| 3922188 | 1/1990 | Fed. Rep. of Germany . |
| 9010394 | 11/1990 | Fed. Rep. of Germany . |
| 4008272 | 5/1991 | Fed. Rep. of Germany . |
| 9108281 | 10/1991 | Fed. Rep. of Germany . |
| 4034774 | 5/1992 | Fed. Rep. of Germany . |

*Primary Examiner*—Gregory D. Thompson
*Attorney, Agent, or Firm*—Spencer, Frank & Schneider

[57] ABSTRACT

The present invention relates to a housing for electrical equipment. The housing is composed of side walls, ventilation openings in the side walls and at least one louver provided in front of the ventilation openings. The housing additionally includes a cover plate which is arranged between the ventilation openings and the louver. The cover plate is inserted into a receptacle at the rear face of the louver. This housing makes it possible to close or open, respectively, existing ventilation openings by means of the cover plates and thus adapt the housing to the respective cooling requirements, whether equipped individually or upon subsequent changes in the equipment.

5 Claims, 1 Drawing Sheet

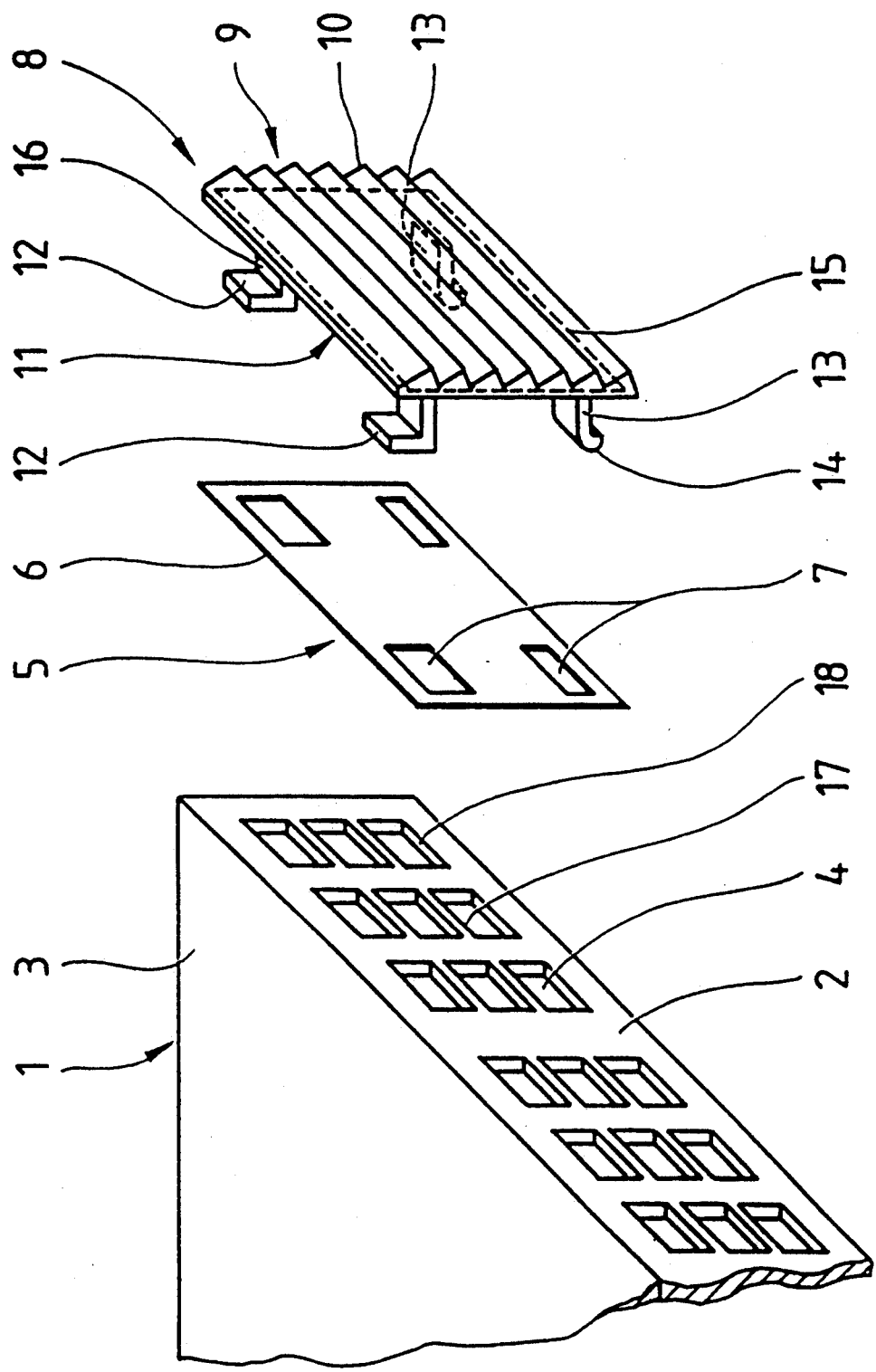

HOUSING

CROSS REFERENCE TO RELATED APPLICATION

This application claims the priority of Application Ser. No. P 42 18 007.4, filed Jun. 1, 1992, in the Federal Republic of Germany, the subject matter of which is incorporated herein by reference.

BACKGROUND OF THE INVENTION

The present invention relates to a housing for electrical equipment. The housing includes side walls, ventilation openings and cover plates for closing the ventilation openings.

The present invention is used primarily for housings made of steel sheet for independent table model units for use in industrial electronic systems.

It is known to permanently provide a certain number of ventilation openings, depending on the particular model, in housings for electrical equipment. These openings cannot be closed again and thus it must be determined before the housings are equipped how much cooling is to be provided in the individual regions of the housing for the highly sensitive electronic units. Specifically, however, if the housings are equipped individually, it may happen that none of the embodiments on the market meets the particular requirements. Another drawback is that, once the housing has been equipped, it is no longer possible to consider subsequent changes, since the making of additional ventilation holes produces dust and chips which penetrate into the interior of the housing and thus may interfere with the proper operation of the electronic device. For example, retrofitting from convection cooling to fan cooling or vice versa creates difficulties since ventilation openings disposed in the side walls cause the generally horizontally arranged blowers to suck in the wrong air through these ventilation openings. In contrast, for good fan cooling it would be appropriate to suck in the cooling air only from the front or the bottom and let it be discharged at the rear or through the cover plate of the housing. Makeshift solutions of, for example, closing the annoying ventilation openings by gluing something over them, generally do not meet safety regulations and are thus not permitted.

A component carrier is known which has side walls and a cover and bottom that are provided with air ventilation holes. Guide rails for circuit boards that are equipped with electronic components and can be inserted one next to the other are provided at the top and bottom. With the aid of pressure and screw lock mechanisms, fittings are fastened to those guide rails that do not carry any circuit boards to close the air ventilation holes in these bottom regions and thus influence the stream of cooling air in the direction toward the existing circuit boards (German Unexamined Published Patent Application DE-OS 3,922,188). However, this proposal is not suitable for influencing the cooling air to be supplied from the outside to housing interiors.

SUMMARY OF THE INVENTION

It is an object of the present invention to design a housing for electrical devices which can be adapted in the simplest manner, without having to open the housing, to the respective cooling requirements whether equipped individually with electronic components or when an already completed installation is changed.

The solution of this problem is based on a housing of the above-mentioned type and the problem is solved in that ventilation openings are provided in the side walls; louvers are arranged in front of the ventilation openings; cover plates can be inserted between the ventilation openings and the louvers; the louvers are provided with receptacles for the cover plates; and fastening devices are shaped to the louvers and are brought through recesses in the cover plates so as to engage in the ventilation openings. These cover plates, in conjunction with the appropriately configured louvers, make it possible to adapt the housing to any individual cooling requirements. The number and arrangement of the open ventilation openings of the housing can be easily changed at any time from the outside by the insertion or removal of these cover plates, even if the equipment has already been installed.

In one advantageous embodiment, the cover plate has a thickness of no more than 0.5 millimeter. In this configuration it is ensured that the cover plate can be inserted into the receptacle in the louver without adding thickness, possibly after appropriate adjustment. In that way it is also ensured that the simple installation of the louvers is not interfered with by the cover plate.

According to a further feature of the invention, the louvers are provided with receptacles for the cover plates. Due to these receptacles, the louvers can be installed with or without cover plates without having to take up different end positions required by a cover plate that adds thickness.

In a preferred embodiment, the receptacles are recesses in the rear faces of the louvers with dimensions that correspond to those of the cover plates so that the cover plates can be placed into the receptacles. In this way a cover plate is prevented from being displaced to thus inadvertently expose ventilation openings.

Superposed slats may be shaped to the louver in an obliquely downward orientation. This feature not only serves to meet the requirements of protection against contact and preventing inadvertent access to the interior of the device but also to keep splashed water from penetrating into the housing. The slats may be configured as air guides to provide an optimum inflow angle to the cooing air. Moreover, the slats also meet aesthetic requirements.

Preferably, the fastening means are hooks and spring clamps whose arrangement corresponds with the recesses in the cover plates and which fit into the ventilation openings. This type of fastening means provides for easy installation without tools and produces a releasable connection.

BRIEF DESCRIPTION OF THE DRAWINGS

The present invention will now be described with reference to the attached drawing. The sole drawing FIGURE is an exploded, slightly enlarged, perspective illustration of part of a housing, a cover plate and a louver.

DETAILED DESCRIPTION OF THE PREFERRED EMBODIMENTS

The housing 1, shown in section, includes an elongate, rectangular side wall 2 and a cover plate 3. A plurality of rectangular ventilation openings 4 are made in side wall 2. Ventilation openings 4 are arranged in two groups each composed of nine individual ventilation openings 4. One group is subdivided into three columns and three rows.

A planar cover plate 5 which has a small wall thickness 6 is shown facing the side wall 2 of housing 1. This cover plate 5 is made of a stiff material and has a rectangular configuration. In its edge region, cover plate 5 is provided with four symmetrically arranged recesses 7. Recesses 7 are also rectangular, with the two upper recesses 7 having almost twice the height dimension of the two lower recesses 7.

A louver 8 is shown in front of cover plate 5. On its exterior face 9 louver 8 is provided with eight horizontal, parallel slats 10. These slats 10 are oriented obliquely downwardly one on top of the other. Fastening devices are shaped to the rear 11 of cover plate 5 which, for reasons of clarity, are shown enlarged. The upper fastening devices are two hooks 12 that are bent upwardly about 90 degrees, and the lower fastening devices are two spring clamps 13 which have a downwardly oriented tab 14. A receptacle 15 for cover plate 5 is indicated in dashed lines at the rear 11 of louver 8. This receptacle 15 has the same areal dimensions as cover plate 5. The depth of receptacle 15 corresponds to the wall thickness 6 of cover plate 8 to prevent possible vibrations of cover plate 8.

In order to fasten louver 8 to housing 1, the four fastening devices are pushed through the respective flush recesses 7 of cover plate 5 and the two hooks 12 are inserted into two of the upper ventilation openings 4. Then louver 8 is moved upward a little until the upwardly oriented faces 16 of hooks 12 abut at the upper edges 17 of ventilation openings 4. Thus, spring clamps 13 are able to slide over the lower edges 18 of the lower ventilation openings 4 and engage. In the engaged state, cover plate 5 lies on ventilation openings 4 and closes them. The ventilation openings 4 in which the fastening means engage are substantially closed.

It will be understood that the above description of the present invention is susceptible to various modifications, changes and adaptations, and the same are intended to be comprehended within the meaning and range of equivalents of the appended claims.

What is claimed is:

1. A housing for electrical equipment having walls, comprising:
   a side wall having at least one ventilation opening;
   a cover plate for closing the at least one ventilation opening, the cover plate having at least one recess; and
   a louver arranged in front of the at least one ventilation opening and having a receptacle for the cover plate so the cover plate can be inserted between the at least one ventilation opening and the louver; and
   fastening means for attaching the louver to the side wall through the at least one recess in the cover plate and engaging in the at least one ventilation opening.

2. A housing as defined in claim 1, wherein the cover plate has a thickness of no more than 0.5 millimeter.

3. A housing as defined in claim 1, wherein the receptacle is a recess in a rear face of the louver, with dimensions of the receptacle corresponding to dimensions of the cover plate.

4. A housing as defined in claim 1, wherein the louver includes at least one obliquely downwardly oriented superposed slats.

5. A housing as defined in claim 1, wherein the fastening means is coupled to the louver and including at least one hook and spring clamp each respectively having an arrangement corresponding with at least one recess in the cover plate and fitting into the at least one ventilation opening.

* * * * *